(12) United States Patent
Yu et al.

(10) Patent No.: US 7,759,748 B2
(45) Date of Patent: Jul. 20, 2010

(54) SEMICONDUCTOR DEVICE WITH REDUCED DIFFUSION OF WORKFUNCTION MODULATING ELEMENT

(75) Inventors: HongYu Yu, Leuven (BE); Shou-Zen Chang, Tervuren (BE); Jorge Adrian Kittl, Waterloo (BE); Anne Lauwers, Aartselaar (BE); Anabela Veloso, Leuven (BE)

(73) Assignees: IMEC, Leuven (BE); Taiwan Semiconductor Manufacturing Company Ltd. (TSMC), Hsin Chu (TW)

( * ) Notice: Subject to any disclaimer, the term of this patent is extended or adjusted under 35 U.S.C. 154(b) by 0 days.

(21) Appl. No.: 11/977,079

(22) Filed: Oct. 23, 2007

(65) Prior Publication Data
US 2008/0105933 A1    May 8, 2008

Related U.S. Application Data

(60) Provisional application No. 60/853,716, filed on Oct. 23, 2006.

(51) Int. Cl.
*H01L 29/58* (2006.01)
(52) U.S. Cl. ............... 257/412; 257/E21.31; 438/197
(58) Field of Classification Search .......... 257/E21.231; 438/197
See application file for complete search history.

(56) References Cited

U.S. PATENT DOCUMENTS 6,873,020 B2    3/2005 Misra 7,410,854 B2 *  8/2008  Yao et al. .............. 438/197
7,504,329 B2    3/2009  Yu
2006/0084247 A1 *  4/2006  Liu .............. 438/510
2006/0286802 A1 * 12/2006  Yu et al. .............. 438/682

FOREIGN PATENT DOCUMENTS

| EP | 1 722 404 | 11/2006 |
| EP | 1722404 A2 | 11/2006 |
| EP | 1 796 151 | 6/2007 |

OTHER PUBLICATIONS

European Search Report, European Patent Application 07075908.9 dated Apr. 24, 2009.
Nazyrov, D.E., "Diffusion of Ytterbium in Silicon", Semiconductors, vol. 37, No. 9, 2003, pp. 1031-1032.
Yu, H.Y. et al., "Modulation of the Ni FUSI Workfunction by Yb Doping: From Midgap to n-Type Band-Edge", International Electron Devices Meeting, IEEE, Piscataway, New Jersey, Dec. 5, 2005, pp. 1-4.

(Continued)

*Primary Examiner*—Howard Weiss
*Assistant Examiner*—Steven H Rao
(74) *Attorney, Agent, or Firm*—McDonnell Boehnen Hulbert & Berghoff LLP

(57) ABSTRACT

A semiconductor device is disclosed that comprises a fully silicided electrode formed of an alloy of a semiconductor material and a metal, a workfunction modulating element for modulating a workfunction of the alloy, and a dielectric in contact with the fully silicided electrode. At least a part of the dielectric which is in direct contact with the fully silicided electrode comprises a stopping material for substantially preventing the workfunction modulating element from implantation into and/or diffusing towards the dielectric. A method for forming such a semiconductor device is also disclosed.

23 Claims, 5 Drawing Sheets

OTHER PUBLICATIONS

Cho, Heung-Jae et al., "Suppressed Boron Penetration in P+ Poly-Si/AL2O3/Si Metal-Oxide-Semiconductor System by Remote Plasma Nitridation of AL2O3 Surface", Extended Abstracts of the 2001 International Conference on Solid State Devices and Materials, Tokyo, 2001, pp. 504-505.

Chen, J.D. et al., "Yb-Doped Ni FUSI for the n-MOSFETs Gate Electrode Application", IEEE Electron Device Letters, vol. 27, No. 3, Mar. 2006, pp. 160-162.

Pantisano, L. et al., "Effective Work Function Modulation by Controlled Dielectric Monolayer Deposition", Applied Physics Letters, vol. 89, 2006, pp. 113505-113505-3.

Pawlak, M.A. et al., "Modulation of the Workfunction of Ni Fully Silicided Gates by Doping: Dielectric and Silicide Phase Effects", IEEE Electron Device Letters, vol. 27, No. 2, Feb. 2006, pp. 99-101.

Kadoshima, M. et al., "Fermi Level Pinning Engineering by Al Compositional Modulation and Doped Partial Silicide for HfAlOx(N) CMOSFETs", VLSI Technology, 2005, Digest of Technical Papers, Jun. 14, 2005, pp. 70-71.

Terai, Masayuki et al., "Highly Reliable HfSiON CMOSFET with Phase Controlled NiSi (NFET) and Ni3Si (PFET) FUSI Gate Electrode", VLSI Technology, 2005. Digest of Technical Papers, 2005 Symposium, On Kyoto, Japan, Jun. 14, 2005, pp. 68-69.

Kim, Y.H. et al., "Tunable Workfunction for Fully Silicied Gates (FUSI) and Proposed Mechanisms", 2006 International Symposium on VLSI Technology, Systems and Applications (VLSI-TSA), IEEE, Piscataway, New Jersey, Apr. 24, 2006, pp. 1-2.

\* cited by examiner

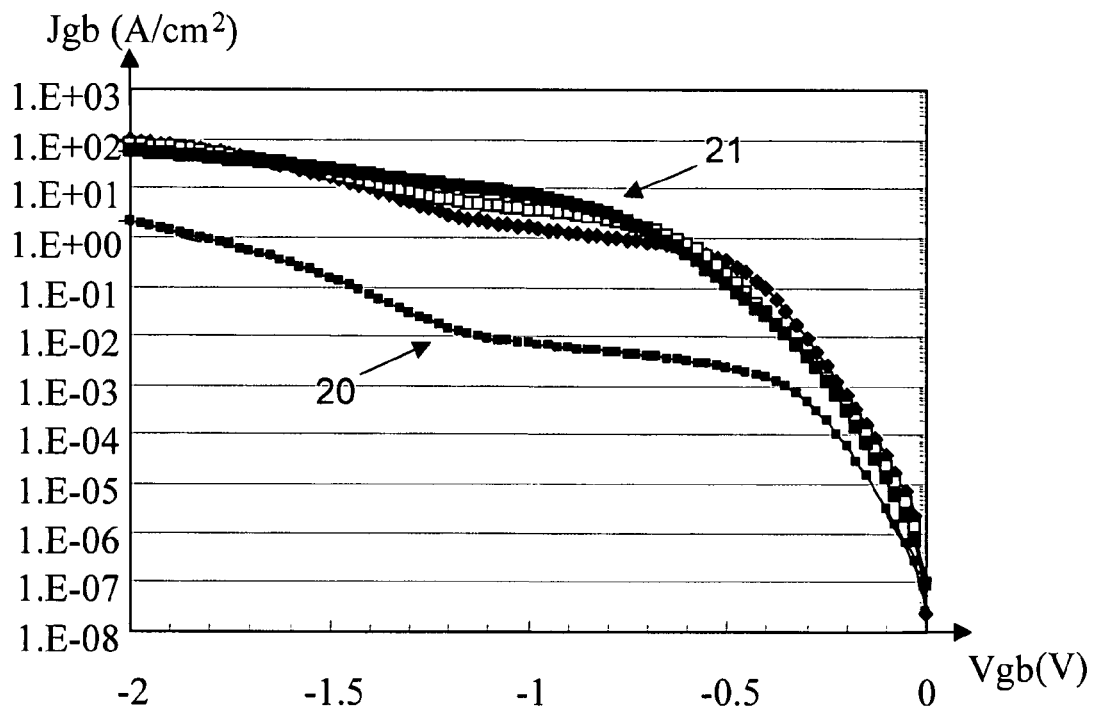
Figure 1 – PRIOR ART
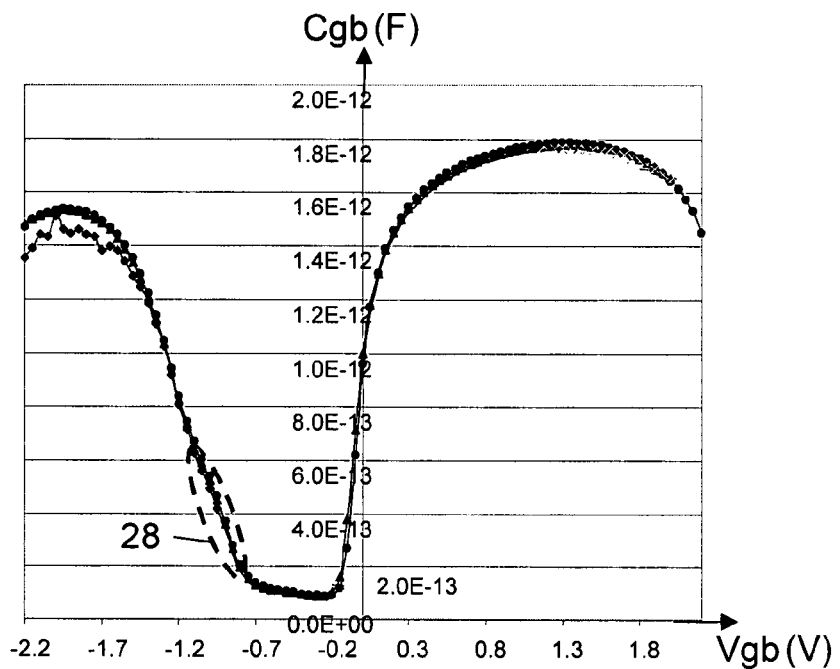
Figure 2 – PRIOR ART

SEMICONDUCTOR DEVICE WITH REDUCED DIFFUSION OF WORKFUNCTION MODULATING ELEMENT

This application claims the priority of U.S. Provisional Patent Application No. 60/853,716, filed Oct. 23, 2006, the disclosure of which is incorporated herein by reference.

BACKGROUND

In mainstream semiconductor technology, MOSFET (metal oxide semiconductor field-effect transistor) devices may be used as basic elements, for example as a switching element or as a charge storage element. A MOSFET device comprises a semiconductor channel region that is dielectrically coupled via a gate dielectric to a gate electrode. The semiconductor channel region is contacted at opposite sides by a source junction and a drain junction.

In order to improve performance of MOSFET devices, polysilicon, which used to be used as gate electrode material, has been replaced by metallic materials. Metallic gates do not suffer from the shortcomings of gate electrodes formed by semiconductor material, such as gate depletion, dopant diffusion or medium range resistance. Recently, there has been a significant interest for the application of silicides to form metal gate electrodes. In particular, fully-silicided (FUSI) gates show to be promising candidates. From a processing point of view, a FUSI gate can be implemented as a variation on a self-aligned silicidation process used in previous technology nodes, e.g. to reduce the sheet resistance of semiconductor regions. In the FUSI approach, silicide is formed in the gate electrode down to its interface with the gate dielectric, thereby fully consuming the polysilicon material of the gate electrode.

Ni-silicide appears to be an attractive candidate to form a gate electrode because it allows maintaining several aspects of the process flow applied in prior CMOS technology generations, such as patterning of the silicon gate and the self-aligned silicide-forming processes. A key property that has attracted attention to NiSi FUSI gates is the possibility to modulate their effective work function on a $SiO_2$ gate dielectric by dopants which may allow for tuning of the threshold voltage ($V_t$) of nMOS and pMOS devices without the need for using a different bulk material for the gate electrode for forming both types of MOSFET. The integration and properties of Ni FUSI gates on high-k dielectrics is also of interest for advanced CMOS applications.

In "Modulation of the Ni FUSI work function by Yb doping: from midgap to n-type band-edge" in technical digest IEDM meeting 2005, p 630-633, H. Y., Yu et al. discloses a method for modulating the work function of a nickel silicide FUSI gate formed on a SiON gate dielectric by incorporating ytterbium in the nickel-silicon gate electrode. The work function of the Ni FUSI gate is reduced from 4.72 eV to 4.22 eV by doping with Yb. It was also reported that Yb is piled up at the interface between the gate electrode and the gate dielectric, which may promote diffusion of the Yb towards and into the gate dielectric.

Not only have there been attempts to replace the polysilicon gate electrode by a metallic gate electrode, but also attempts have been made to reduce the thickness of the gate dielectric layer. The thickness of a conventional silicon oxide gate dielectric has reached its practical limits. The equivalent electrical oxide thickness (EEOT) of the dielectric material needs to be in the 0.5 nm to 2 nm range to ensure good dielectric coupling. However, silicon oxide layers with a thickness of 0.5 nm to 2 nm may not be able to withstand voltages applied and thus a thicker dielectric layer is needed. This leads to the use of high-k dielectric materials which offer a sufficient physical thickness and a limited EEOT, the ratio being defined by the dielectric constant (k-value) of the dielectric material. For this purpose, other materials are being investigated as alternative materials to form the gate dielectric. In first instance silicon oxynitride is used as an alternative gate dielectric material. Other alternative dielectric materials are being considered which have an EEOT of a few nanometers but have a larger physical thickness. As these alternative materials are characterized by a higher dielectric constant compared to the dielectric constant of silicon oxide (k=3.9), they have been called high-k dielectric materials. These high-k dielectric materials have a k-value in the range of between 4 and 40.

When fabricating a MOSFET device having a FUSI gate electrode comprising a dopant, in particular a dopant used as a work function modulating element, it has been observed that the electrical characteristics of the MOSFET device deviate from a MOSFET device without such dopant. In particular, if an ytterbium doped nickel FUSI gate electrode of an n-type MOSFET is formed in particular on a silicon oxynitride gate dielectric, the leakage current through the gate dielectric may increase compared to an ytterbium-free nickel FUSI gate electrode. This is shown in FIG. 1 which illustrates the gate current density vs. gate voltage or $Jgb(A/cm^2)$-Vgb (V) characteristic obtained for a capacitor structure comprising an Yb-free NiSi FUSI gate electrode formed on a SiON dielectric (indicated with reference number 20, filled squares) and for capacitor structures comprising a Yb-doped NiSi FUSI gate electrode formed on a SiON dielectric (indicated with reference number 21, filled diamonds for a 80 nm thick polysilicon layer doped with Yb at an energy of 30 keV, open squares for a 60 nm thick polysilicon layer doped with Yb at an energy of 30 keV and filled squares for a 40 nm thick polysilicon layer doped with Yb at an energy of 20 keV, in all cases the Yb concentration was 4e15 $cm^{-2}$). The gate leakage current density for the Yb-doped NiSi FUSI gate electrode is about two orders of magnitude higher than the gate leakage current density for the NiSi FUSI gate electrode. This leakage current increases with decreasing gate dielectric thickness.

Also, the capacitance-voltage characteristics of such gate stack show anomalies which indicate the presence of a larger number of interface states $D_{it}$. This is shown in FIG. 2 which illustrates gate capacitance vs. gate voltage or Cgb(F)-Vgb (V) characteristics obtained for capacitor structures comprising an Yb-doped NiSi FUSI electrode formed on a SiON gate dielectric. FIG. 2 shows four curves obtained from four different devices. Two curves were obtained from devices formed by doping the NiSi FISU electrode with Yb at a dose of 4e15 $cm^{-2}$ and with an energy of 40K and two curves were obtained from devices doped with Yb at a dose of 2e15 $cm^{-2}$ and with an energy of 40K. It can be seen that all curves in FIG. 2 substantially coincide. What is more important is that a bump is observed in all of the capacitance-voltage curves which is indicated by the dotted zone 28. This bump is indicative for the presence of interface states $D_{it}$. Moreover, it has also been observed that the workfunction of the nickel ytterbium FUSI gate may vary with time.

SUMMARY

The present disclosure relates to semiconductor devices. More particularly, the present disclosure relates to a semiconductor device comprising a dielectric and an electrode comprising a workfunction modulating element, the electrode being in direct contact with the dielectric. At least part of the dielectric which is in direct contact with the electrode comprises a stopping material, e.g. a metal, for preventing implantation into and/or diffusion towards the dielectric of the workfunction modulating element. The present disclosure also provides a method for forming such a semiconductor device.

The semiconductor devices according to embodiments described herein address the problem of high leakage currents when workfunction modulating elements are used to modulate the workfunction of the material of which a main electrode, e.g. a gate of the semiconductor device, is formed.

A semiconductor device is described, which comprises a fully silicided electrode formed of an alloy of a semiconductor material and a metal. The electrode includes a workfunction modulating element for modulating a workfunction of the alloy. The semiconductor device further comprises a dielectric in contact with the fully silicided electrode. At least part of the dielectric, the part being in direct contact with the fully silicided electrode, comprises a material, hereinafter referred to as a stopping material, for substantially preventing implantation and/or diffusion of the workfunction modulating element into or towards the dielectric.

The semiconductor devices described herein demonstrate a lower leakage current when compared to a semiconductor device comprising a dielectric having no stopping material, e.g. stopping metal, in contact with the fully silicided electrode.

The present disclosure provides a semiconductor device comprising a fully silicided electrode, being an alloy of a semiconductor material and a metal. The electrode further comprising an element for modulating the workfunction of the alloy. A dielectric is in contact with the electrode. The part of the dielectric in contact with the electrode comprises a material, e.g. a metal, selected to essentially stop the diffusion of the workfunction modulating element towards the dielectric and/or the implantation of the workfunction modulating element into the dielectric.

The stopping material may be a metal, e.g. a metal selected from the group of lanthanides and aluminum and may, for example, be hafnium.

The dielectric may comprise at least a first layer and a second layer. In such an embodiment, the first layer may be in direct contact with the fully silicided electrode and may comprise the stopping metal.

According to other embodiments, the dielectric may be formed of a single layer. According to these embodiments, the single layer of dielectric may comprise a concentration gradient of the stopping metal increasing in a direction from the substrate on which the dielectric is formed towards the fully silicided electrode.

According to yet other embodiments, the dielectric may also be formed of a single layer, but the stopping metal may be uniformly distributed over the single layer of dielectric.

The part or layer of the dielectric comprising the stopping metal may have a thickness of between 1 monolayer and 10 nm.

The part or layer of the dielectric comprising the stopping material, e.g. stopping metal, may furthermore comprise at least one of Si, O, and N.

The semiconductor material may comprise one of silicon, silicon germanium and germanium.

The metal forming an alloy with the semiconductor material may be selected to form an alloy having a midgap-type workfunction. The metal may comprise nickel.

The workfunction modulating element may be selected to modulate the workfunction of the alloy towards an n-type workfunction. The workfunction modulating element may be selected from the group of lanthanides and may, for example, be ytterbium. According to alternative embodiments, the workfunction modulating element may be selected to modulate the workfunction of the alloy towards a p-type workfunction.

In a further aspect, the present disclosure provides method for forming a semiconductor device. A dielectric is provided on a substrate. A fully silicided electrode is provided on and in direct contact with the dielectric. The fully silicided electrode comprises an alloy of a semiconductor material and a metal. The electrode further comprises workfunction modulating element. In this method, a stopping material, such as a stopping metal, is provided in at least a part of the dielectric—the part being in direct contact with the fully silicided electrode—for substantially preventing implantation and/or diffusion of the workfunction modulating element into or towards the dielectric.

In an aspect, the present disclosure provides a method for forming a semiconductor device. The device formed comprises a fully silicided electrode comprising an alloy of a semiconductor material and a metal. The electrode further comprises an element for modulating the workfunction of the alloy. A dielectric is in contact with the electrode—at least the part of the dielectric in contact with the electrode. The dielectric comprises an element selected to essentially stop the diffusion towards and/or the implantation into the dielectric of the workfunction modulating element. In a method of forming such a device, a substrate is provided. A dielectric is formed on the substrate, such that at least the upper part of the dielectric comprises the stopping element. The fully silicided electrode is formed on the upper part of the dielectric.

The step of providing a dielectric may be performed by providing a stack of at least a first and second layer, with the first layer being in direct contact with the fully silicided electrode. The step of providing a stopping material, e.g. stopping metal, in at least part of the dielectric may be performed by providing the stopping metal in the first layer.

According to other embodiments, the step of providing a dielectric may be performed by providing a single layer of dielectric. In such embodiments the step of providing a stopping material, e.g. stopping metal, in at least a part of the dielectric may be performed such that a concentration gradient of the stopping material, e.g. stopping metal, is built up. The concentration gradient may increase in a direction from the substrate on which the dielectric is formed towards the fully silicided electrode.

According to still other embodiments, providing a dielectric may also be performed by providing a single layer of dielectric, and providing a stopping material, e.g. stopping metal, in at least a part of the dielectric may be performed such that the stopping material, e.g. stopping metal, is uniformly distributed over the dielectric.

Providing a stopping material, e.g. stopping metal, in at least a part of the dielectric may be performed such that the part of the dielectric comprising the stopping material has a thickness of between 1 monolayer and 10 nm.

The part of the dielectric comprising the stopping material may furthermore comprise at least one of Si, O, and N.

The stopping material, when it is a metal, may be selected from the group consisting of lanthanides and aluminum, and may, for example, be hafnium.

The step of providing a fully silicided electrode may be performed by providing a layer of semiconductor material, providing a workfunction modulating element in the semiconductor material, providing a layer of silicide-forming metal, and forming an alloy of the semiconductor material and the silicide-forming metal. The providing of a layer of semiconductor material may be performed by providing a layer comprising one of silicon, silicon germanium, and germanium.

Providing a layer of silicide-forming metal may be performed so as to form an alloy having a midgap-type workfunction. The silicide-forming metal may, for example, comprise nickel.

Providing a workfunction modulating element may be performed such that the workfunction of the alloy is modulated towards an n-type workfunction. The modulating element may be selected from the group of lanthanides, and may, for example, be ytterbium. Alternatively, providing a workfunction modulating element may be performed such that the workfunction of the alloy is modulated towards a p-type workfunction.

In a further aspect, the present disclosure provides a semiconductor device obtained by the methods described herein.

Particular and preferred aspects of the invention are set out in the accompanying independent and dependent claims. Features from the dependent claims may be combined with features of the independent claims and with features of other dependent claims as appropriate and not merely as explicitly set out in the claims.

The above and other characteristics, features and advantages will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

Exemplary embodiments are illustrated in referenced figures of the drawings. It is intended that the embodiments and figures disclosed herein should be considered illustrative rather than restrictive. In the drawings, the size of some of the elements may be exaggerated and not drawn on scale for illustrative purposes.

FIG. 1 compares the gate current density vs. gate voltage characteristic obtained for a capacitor structure comprising an Yb-free NiSi FUSI gate electrode and for a MOSFET comprising an Yb-doped NiSi FUSI gate electrode, both formed on a prior art SiON dielectric.

FIG. 2 shows gate capacitance vs. gate voltage characteristics obtained for capacitor structures comprising an Yb-doped NiSi FUSI electrode formed on a prior art SiON dielectric.

Figure 3:
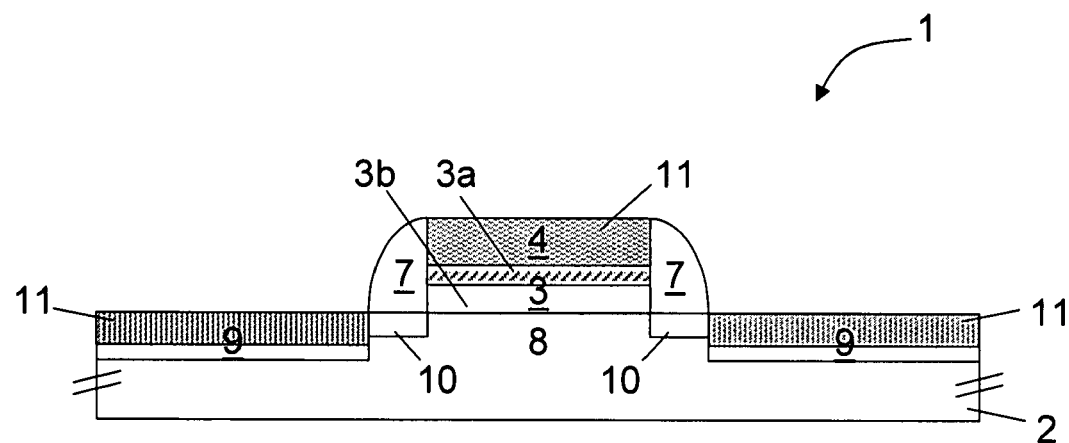
FIG. 3 schematically shows a cross-section of a MOSFET device.

In the different figures, the same reference signs refer to the same or analogous elements.

DETAILED DESCRIPTION

The present invention will be described with respect to particular embodiments and with reference to certain drawings, but the invention is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

The invention will now be described by a detailed description of several embodiments. It is clear that other embodiments can be configured according to the knowledge of persons skilled in the art without departing from the true technical teaching of the present disclosure, the claimed invention being limited only by the terms of the appended claims.

In the following certain embodiments will be described with reference to devices structures such as transistors. These are three-terminal devices having a first main electrode such as a drain, a second main electrode such as a source and a control electrode such as a gate for controlling the flow of electrical charges between the first and second main electrodes. However, the invention is not limited thereto. For example, the embodiments may be applied to other device structures such as metal-insulator-metal capacitors or to memory devices such as DRAM or non-volatile memories.

In the following description, the term "transistor" is intended to refer to a semiconductor device comprising a semiconductor channel region which is dielectrically coupled to a gate electrode via a gate dielectric. The semiconductor channel region is contacted at opposite sides by a source junction and a drain junction. Various types of transistor architectures are known. In a planar gate device the channel region is only controlled by the gate electrode from one side. Planar gate devices can be formed on a bulk semiconductor substrate or on a semiconductor-on-insulator substrate. For multi-gate devices the channel of the device is controlled by the gate electrode from multiple sides. The body of semiconductor material wherein the channel is formed is made as thin as possible to allow a more efficient control by the gate electrode. For example, the body of a fin-FET may have a thickness in the range of between 10 nm and 100 nm. In 32 nm technology for example the fin width may be in the range of between 10 nm and 20 nm.

In the following description, various embodiments will be described with reference to a silicon substrate, but it should be understood that the invention also applies to other semiconductor substrates. The "substrate" may include a semiconductor substrate such as e.g. a silicon (Si), a gallium arsenide (GaAs), a gallium arsenide phosphide (GaAsP), an indium phosphide (InP), a germanium (Ge) or a silicon germanium (SiGe) substrate. The "substrate" may include for example, an insulating layer such as a $SiO_2$ or a $Si_3N_4$ layer in addition to a semiconductor substrate portion. Thus, the term substrate also includes semiconductor-on-insulator substrates such as silicon-on-glass, silicon-on sapphire substrates, silicon-on-insulator (SOI) substrates, germanium-on-insulator substrates (GOI). The term "substrate" is thus used to refer generally to the elements or layers that underlie a layer or portions of interest. Accordingly, a substrate may be a wafer such as a blanket wafer or may be a layer applied to another base material, e.g. an epitaxial semiconductor layer grown onto a lower layer. The term "crystalline substrate" is intended to include various forms of crystalline material, such as monocrystalline or microcrystalline.

In the following description, the term "high-k dielectric materials" is used to refer to dielectric materials having a dielectric constant higher than that of silicon oxide (k=3.9). These high-k materials generally have a k-value in the range of 4 to 40. Some examples of these high-k materials are oxides or silicates of hafnium, tantalum, and zirconium, which have k-values in the range of 20-26.

In the following embodiments, the term "silicide" is used to refer to a compound of one or more metals with a semiconductor material, such as silicon, silicon-germanium or germanium. In the context of the present disclosure, the terms "silicide", "silicided", "silicidation" refer to the reaction between a metal and semiconductor, but are not intended to be limited to silicon. For example, the reaction of a metal with Ge, or any other suitable semiconductor material such as silicon germanium (SiGe) may still be referred to as silicidation and the compounds formed may be referred to as silicides.

Silicides may easily be formed by a thermal reaction of a variety of metals with semiconductor materials such as silicon. Silicides may typically be formed in a two step process, e.g. a first thermal treatment at a first temperature and a second thermal treatment at a second temperature higher than the first temperature. In between the two thermal steps, unreacted metal may selectively be removed. The second thermal step may be used to reduce the sheet resistance of the silicide and/or to obtain a complete silicidation of the semiconductor material in contact with the silicide. The thermal treatment may preferably be done using rapid thermal processing. The parameters of the thermal process, e.g. time and temperature, may be selected in view of the silicide to be formed.

In the following description, the workfunction of a material is to be interpreted as the minimum energy that is needed to remove an element (electron) from the solid material.

A fully silicided (FUSI) gate electrode is formed by a reaction between silicide-forming metals and the semiconductor gate electrode, thereby fully consuming the semiconductor material of the gate electrode.

In a first aspect of the present disclosure, a semiconductor device is provided. The semiconductor device comprises a fully silicided electrode (FUSI) formed of an alloy of a semiconductor material and a metal, and comprising a workfunction modulating element for modulating a workfunction of the alloy. A dielectric is in contact with the fully silicided electrode At least a part of the dielectric—the part in direct contact with the fully silicided electrode—comprises a stopping material, e.g. stopping metal, for substantially preventing implantation into and/or diffusion towards the dielectric of the workfunction modulating element.

In general, the part of the dielectric comprising the stopping material, e.g. stopping metal, may range from one or more monolayers to about 10 nm. The part of the dielectric comprising the stopping material, e.g. stopping metal, may have a thickness in the range of between 1 nm and 5 nm, and may, for example, be 2 nm. The thickness of the part of the dielectric comprising the stopping material, e.g. stopping metal, may be selected to essentially maintain the polarity type, i.e. n-type or p-type, of the workfunction of the FUSI gate electrode.

Semiconductor devices according to various embodiments will, for heuristic purposes, be described by reference to a planar MOSFET transistor. It has to be understood that this is only for ease of explanation and the description is not intended to limit the invention in any way. The present invention also applies to other types of transistors, and, more generally, to any other semiconductor device comprising a FUSI electrode in direct contact with a dielectric.

FIG. 3 schematically shows a cross-section of a MOSFET device 1 formed on a substrate 2. The MOSFET device 1 comprises a gate stack 3, 4 formed of a gate dielectric 3 and a fully silicided (FUSI) gate electrode 4. The gate dielectric 3 comprises a stopping material, e.g. stopping metal, in at least a part thereof, the part being in direct contact with the FUSI electrode 4. If a stopping metal is used as the stopping material, the stopping metal may be selected from the group consisting of lanthanides and aluminium. The stopping metal may, for example, be hafnium.

In the substrate 2, lowly doped junction regions 10 may be present which are aligned to the gate stack 3, 4. Sidewall spacers 7 may be present against the sidewalls of the gate stack 3, 4. These sidewall spacers 7 may comprise a dielectric material such as, for example, silicon oxide, silicon nitride, silicon carbide, silicon nitride, or a combination thereof. Aligned to the sidewall spacers 7, highly doped junction regions 9 may be present in the substrate 2. The lowly doped regions 10 and highly doped regions 9 form the source and drain regions and are formed on opposite sides of a channel region 8 of the MOSFET device 1. The FUSI gate electrode 4 is formed of an alloy of a semiconductor material with a silicide-forming metal.

In the context of the present disclosure, a suitable silicide-forming metal may be a refractory metal such as cobalt, tungsten or titanium, or a metal, such as nickel or platinum.

In case an n-type MOSFET is to be fabricated, the silicide-forming metal should be selected so as to yield a silicide having an n-type workfunction. Therefore, the workfunction of the silicide should have a value from approximately the middle of the energy gap of the semiconductor material which is to be silicided to the bottom of the conduction band thereof. This is also referred to as midgap-type workfunction. If, for example, silicon is used as a semiconductor material the n-type workfunction of the silicide formed may range from 4.2 eV to 4.7 eV.

If a p-type MOSFET is to be fabricated, a suitable silicide-forming metal should be selected so as to yield a silicide having a p-type workfunction. Therefore, the workfunction of the silicide should have a value from approximately the middle of the forbidden energy gap of the semiconductor material which is to be silicided to the top of the valence band thereof. If, for example, silicon is used as a semiconductor material, the workfunction of the silicide may range from 4.7 eV to 5.2 eV. Preferably, the workfunction of the silicide may have a value of halfway the bottom of the conduction band and the top of the valence band with a variation of 10%. In this way, a midgap material may be obtained which is suitable to be used for n-type devices and for p-type devices. Furthermore, because the difference in work function of the gate and of the channel is reduced, the threshold voltage $V_t$ of the device may also be reduced. If silicon is used as a semiconductor material the workfunction of the silicide may preferably be 4.7 eV±0.2 eV.

If a nickel silicide FUSI gate is formed, a workfunction value of about 4.7 eV may be obtained. This workfunction can be tuned to be closer to the conduction band of silicon, e.g., towards a value of 4.1 eV, if an n-type MOSFET is to be fabricated. Such a lowering in workfunction can be obtained by doping the nickel silicide with elements such as lanthanides, e.g., Ytterbium (Yb), or elements such as Arsenic (As), Antimony (Sb), or Phosphorous (P). H. Y. Yu et al. disclose in "Modulation of the Ni FUSI workfunction by Yb doping: from midgap to n-type band-edge" in technical digest IEDM meeting 2005, p 630-633, in FIG. 3(b) and corresponding paragraph on page 601, that the value of the workfunction of nickel silicide can be varied from about 4.7 eV to about 4.2 eV by varying the ratio of Yb to Ni. The workfunction can be tuned to be closer to the valence band of silicon, i.e., towards a value of 5.2 eV, if a p-type MOSFET is to be fabricated. Such a shift in workfunction can be obtained by doping the nickel silicide with elements such as Platinum (Pt) or boron (B). The dopants used for the purpose of tuning the workfunction may be referred to as workfunction modulating elements. The type and amount of workfunction modulating element may be selected depending on the workfunction of the silicide formed and on the workfunction desired for a particular type of MOSFET device. The amount of workfunction modulating element may vary from $1e14 \text{ cm}^{-3}$ to $1e16 \text{ cm}^{-3}$. A disadvantage of using a workfunction modulating element is that it increases the leakage current of the semiconductor device 1 formed.

Therefore, according to embodiments described herein, a stopping material, e.g. stopping metal, is provided in at least part of the dielectric layer 3—the part in direct contact with the gate electrode 4. The stopping material is provided for stopping the implantation and/or diffusion of workfunction modulating elements in and towards the gate dielectric 3. The stopping material, e.g. stopping metal, may be selected from the group consisting of lanthanides and aluminum. According to embodiments described herein, the gate dielectric 3 may comprise multiple layers of dielectric material 3a, 3b, whereby a dielectric layer 3a which is in direct contact with the gate electrode 4 comprises the stopping material, e.g. stopping metal, while the other dielectric layers 3b which are not in direct contact with the gate electrode 4 may be a silicon oxide, a silicon oxynitride, a high-k dielectric, or combinations thereof. In the example given in FIG. 3, the dielectric 3 comprises two layers 3a, 3b. It has to be understood that this is not intended to limit the invention, and the dielectric 3 may comprise any suitable number of layers of dielectric material.

The gate dielectric 3 may thus comprise a stack of a first dielectric layer in direct contact with the gate electrode 4. The gate dielectric may further comprise a dielectric layer 3a comprising a stopping material, e.g. metal, such as e.g. a metal oxide, metal silicon oxide or metal silicon oxynitride and a second dielectric layer 3b such as silicon oxide, e.g. $SiO_2$, or silicon oxynitride, e.g. SiON. The thickness of the stopping material-comprising dielectric layer 3a may range from one or more monolayers to about 10 nm. The thickness of the stopping-material-comprising layer 3a may be in the range of about 1 nm to 5 nm, and may, for example, be 2 nm. The thickness of the stopping-material-comprising layer 3a may be selected to essentially maintain the polarity type, e.g. n-type or p-type, of the workfunction of the FUSI gate electrode 4.

According to a specific example, the stopping material may be a metal such as hafnium and the gate dielectric 3 may comprise hafnium in at least a part 3a of the gate dielectric 3 which is in direct contact with the FUSI gate electrode 4. The hafnium-comprising gate dielectric 3a may comprise a hafnium oxide, e.g., $HfO_2$, a hafnium silicon oxide, e.g. $HfSiO_2$, or a hafnium silicon oxynitride, e.g., HfSiON.

The dielectric layer 3b which is not in direct contact with the gate electrode 4 may comprise a semiconductor material, such as e.g. silicon oxide, ($SiO_2$), a silicon oxynitride (SiON), a high-k dielectric, or combinations thereof.

For example, the MOSFET device 1 may be an n-type MOSFET device 1 having a gate dielectric 3 and a gate electrode 4 comprising a metallic alloy (silicide) with a low workfunction, e.g. between 4.2 eV and 4.7 eV in case of the alloy being formed of silicon, in contact with the gate dielectric 3. The low workfunction alloy may comprise a suitable metal for silicidation, a semiconductor material and at least one workfunction modulating element, e.g. lanthanide for modulating the workfunction of the alloy. The semiconductor material may, for example, comprise Si, Ge, or SiGe. The group of lanthanides consists of 15 elements from lanthanum to lutetium in the periodic table, including lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

According to a specific embodiment, the n-type MOSFET device 1 may comprise silicon as the semiconductor material, nickel as the silicide-forming metal and Yb as the workfunction modulating element. At least part of the gate dielectric 3 in direct contact with the gate electrode 4 may comprise a hafnium silicon oxide or a hafnium silicon oxynitride.

Figure 4:
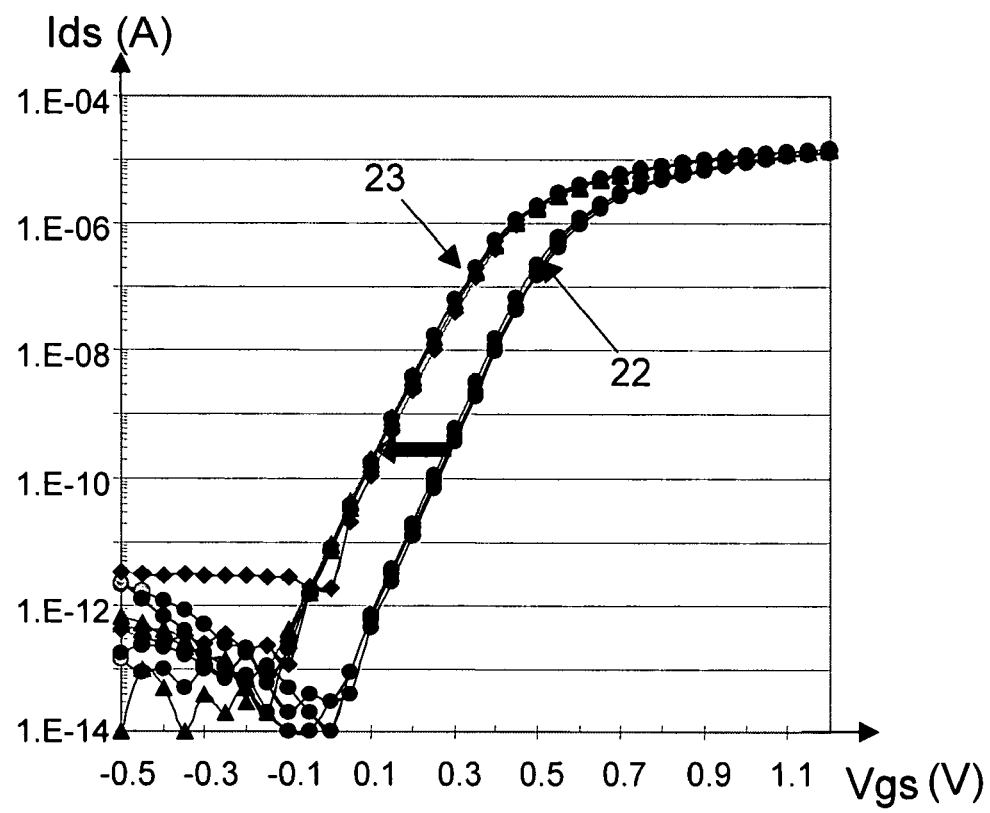
FIG. 4 compares the drain-to-source current vs. gate-to-source voltage characteristic obtained for a MOSFET comprising a NiSi FUSI gate electrode, and for a MOSFET comprising an Yb-doped NiSi FUSI gate electrode, both using a hafnium-comprising gate dielectric.
Figure 5:
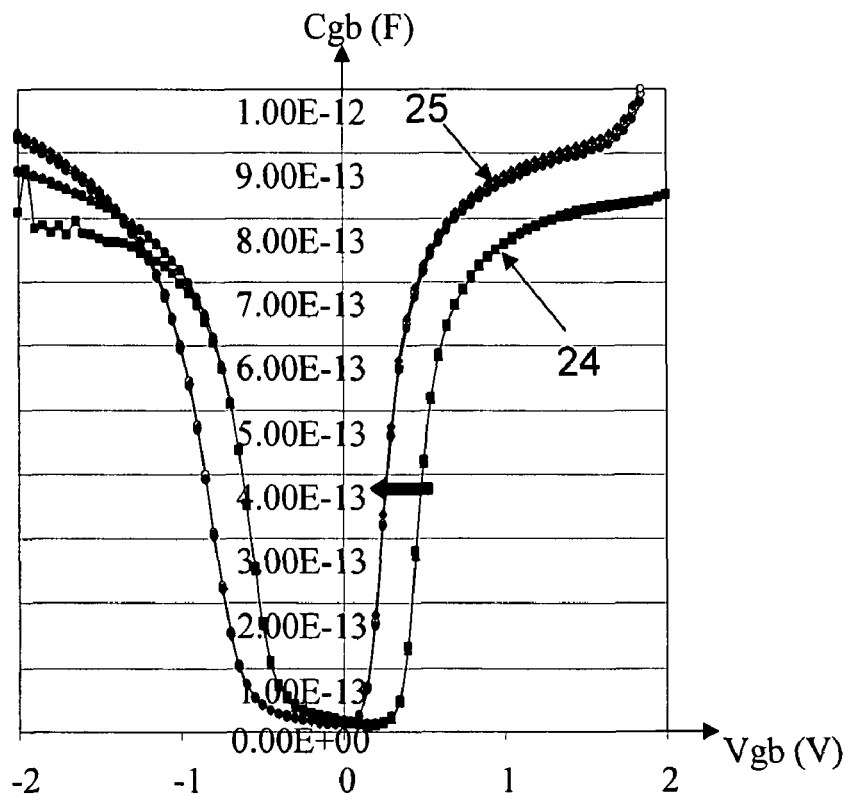
FIG. 5 shows gate capacitance vs. gate voltage characteristics obtained for capacitor structures comprising a NiSi FUSI gate electrode and for capacitor structures comprising an Yb-doped NiSi FUSI gate electrode, both using a hafnium comprising gate dielectric.

In FIG. 4 and FIG. 5, the electric performance of an n-type MOSFET device 1 comprising an ytterbium (Yb)-doped nickel FUSI gate electrode 4 on a HfSiON gate dielectric 3 is compared with an undoped nickel FUSI gate electrode 4 formed on an HfSiON gate dielectric 3. In this example, Yb was implanted in the semiconductor gate electrode 4 with a dose of 4e15 cm$^{-2}$ at an energy of 40 keV. Afterwards, 60 nm nickel was deposited on the Yb-doped polysilicon gate electrode 4. Then a silicidation process was performed. The temperature of a first silicidation step was varied from 370° C. to 380° C. for a period of about 30 s. Then, a selective wet etching step was performed in a mixture of sulfuric acid, peroxide and water. Thereafter, a second silicidation step was performed to remove unreacted nickel. The second silicidation step was performed at a temperature of 520° C. for a period of about 30 s.

FIG. 4 compares the Ids(A)-Vgsb(V) (drain current vs. gate voltage) characteristics at a drain-source voltage Vds=50 mV for an undoped NiSi FUSI gate electrode 4 (curves indicated with reference number 22) and an Yb-doped NiSi FUSI gate electrode 4 (curves indicated with reference numbers 23), both formed on a HfSiON gate dielectric 3. Reference number 22 indicates curves obtained from undoped NiSi FUSI gate electrode 4 on a same wafer (labelled D15_1, D15_2, D15_3 in table 1 below). Reference number 23 indicates three curves (labelled D16_1, D16_2, D16_3 in table 1 below) obtained from Yb-doped NiSi FUSI gate electrodes formed on a same wafer wherein the first silicidation step was performed at a temperature of 370° C. for 30 seconds and three curves (labelled D17_1, D17_2, D17_3 in table 1 below) obtained from Yb-doped NiSi FUSI gate electrodes formed on a same wafer wherein the first silicidation step was performed at a temperature of 380° C. for 30 seconds. Details of the experiments for obtaining curves 22 and 23 are summarized in Table 1.

TABLE 1 experimental details with respect to FIG. 4.

| HfSiON dielectric | | Vtlin (V) | VT shift (mV) (to reference undoped FUSI) |
|---|---|---|---|
| Yb doped | D16_1 | 0.44 | 170 |
| 40 keV 4e15 | D16_2 | 0.44 | 170 |
| 370 C. RTP1 | D16_3 | 0.44 | 170 |
| undoped | D15_1 | 0.61 | |
| | D15_2 | 0.6 | |
| | D15_3 | 0.6 | |
| Yb doped | D17_1 | 0.45 | 160 |
| 40 keV 4e15 | D17_2 | 0.43 | 180 |
| 380 C. RTP1 | D17_3 | 0.43 | 180 |

The current-voltage characteristics (indicated with reference number 23) of the Yb-doped NiSi FUSI gate electrode 4 show a similar behaviour to those of the NiSi FUSI gate electrode 4, while the workfunction is reduced by 160 mV to 180 mV, as indicated by the black arrow. This is due to the Yb incorporated in the NiSi of the gate electrode 4. Whereas the undoped NiSi FUSI gate electrode 4 on a HfSiON gate dielectric 3a has a threshold voltage of about 0.6 V, the Yb-doped FUSI gate electrode 4 on a HfSiON gate dielectric 3a has a threshold voltage in the range of between 0.4 V and 0.45 V, which indicates that by providing a layer comprising a stopping metal, in the example given Hf, according to embodiments described herein, lowers the threshold voltage of the semiconductor device 1 formed.

FIG. 5 compares the Cgb(F)-Vgb(V) (gate capacitance vs. gate voltage) characteristics for the undoped NiSi FUSI gate electrode 4 (curves indicated with reference number 24) and the Yb-doped NiSi FUSI gate electrode 4 (curves indicated with reference number 25), both formed on a HfSiON gate dielectric 3. For the case of undoped NiSi FUSI gate electrodes three different measurements were performed on undoped NiSi wherein, during formation, the first silicidation step in the silicidation process was performed at 370° C. For the case of Yb—NiSi FUSI gate electrodes two different measurements were performed on NiSi which was doped with an Yb concentration of 4e15 cm$^{-2}$ at an energy of 40 keV and wherein, during formation, the first silicidation step in the silicidation process was performed at 380° C. The capacitance-voltage characteristics of the Yb-doped NiSi FUSI gate electrode 4 show a same behaviour than the undoped NiSi FUSI gate dielectric 4. The bump in the negative voltage range caused by interface states which was present for NiSi FUSI gates formed on a SiON gate dielectric (see FIG. 2) has now disappeared, while the workfunction is reduced by 160 mV to 180 mV as indicated by the black arrow. Again, reduction of the workfunction is due to the Yb incorporated in the NiSi of the gate electrode 4. Whereas the undoped FUSI gate electrode 4 on a HfSiON gate dielectric 3 (curve 24) has a threshold voltage of about 0.6 V, the Yb-doped FUSI gate electrode 4 formed on a HfSiON gate dielectric 3 has a threshold voltage in the range of 0.4 V to 0.45 V, which again indicates that providing a layer comprising a stopping metal, in the example given Hf, according to embodiments described herein, lowers the threshold voltage of the semiconductor device 1 formed.

Figure 6:
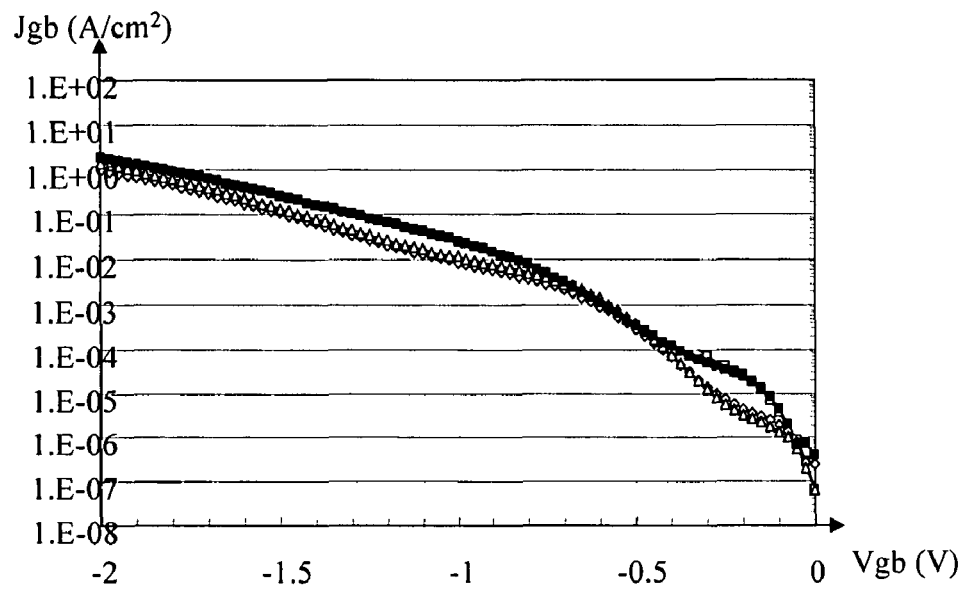
FIG. 6 shows gate current vs. gate voltage characteristics obtained for a capacitor structure comprising an Yb-doped NiSi FUSI gate electrode formed on a hafnium comprising gate dielectric.

FIG. 6 illustrates the Jgb(A/cm$^2$)-Vgb(V) (gate leakage current density vs. gate voltage) characteristic obtained for a capacitor structure comprising an Yb-doped NiSi FUSI gate electrode 4 on a hafnium comprising layer 3a, in the example given a HfSiON layer. The thickness of the gate electrode 4 was varied from 40 nm to 80 nm. Yb was implanted in the semiconductor gate electrode 4 with a dose of 4e15 cm$^{-2}$ at an energy of 40 keV. Afterwards, 80 nm nickel (filled diamonds in FIG. 6), 60 nm nickel (open triangles in FIG. 6), or 40 nm nickel (filled squares in FIG. 6) was deposited on the Yb-doped polysilicon gate electrode. Then a silicidation process was performed. The temperature of a first silicidation step was varied from 370° C. to 380° C. for a period of about 30 s. Then, a selective wet etching step was performed in a mixture of sulfuric acid, peroxide and water. Thereafter, a second silicidation step was performed to remove unreacted nickel. The second silicidation step was performed at a temperature of 520° C.

When comparing the gate leakage current density for an Yb-doped NiSi FUSI gate electrode and an undoped NiSi FUSI gate electrode, both formed on a SiON gate dielectric 3 and shown in FIG. 1, to the gate leakage current density of an Yb-doped NiSi FUSI gate electrode 4 formed on a hafnium-comprising layer 3a according to embodiments described herein and shown in FIG. 6, the gate leakage current is about two orders of magnitude less for the Yb-doped NiSi FUSI gate electrode 4 formed on the hafnium comprising dielectric 3 than for an Yb-doped NiSi FUSI gate electrode formed on a hafnium-free layer 3a. When compared to the capacitor structure comprising an undoped NiSi FUSI gate electrode formed on a SiON gate dielectric, the leakage current may be of a same order of magnitude. Hence, by providing a stopping metal, in the example given hafnium, in the dielectric 3 as described by embodiments disclosed herein, the leakage current of the device, which is a disadvantage of the incorporation of the workfunction modulating element in the gate electrode 4, this leakage current can be decreased. It was furthermore observed that the gate leakage current did not substantially depend on the thickness of the starting polysilicon layer, as a 40 nm and a 80 nm polysilicon layer yielded comparable leakage current values.

By providing a stopping material, e.g. a stopping metal, in the part of the gate dielectric 3 which is in direct contact with the gate electrode 4, the gate leakage current of the semiconductor device 1 formed can be decreased as compared to semiconductor devices which do not comprise a stopping material, e.g. a stopping metal, in the gate dielectric 3.

The gate dielectric 3 may comprise a first and a second layer 3a, 3b as indicated in FIG. 3. In such embodiments, the stopping material, e.g. a stopping metal, may be provided in the first layer 3a which is in direct contact with the gate electrode 4. However, according to other embodiments, the gate dielectric 3 may be formed of a single layer, and the single layer of gate dielectric 3 may comprise a concentration gradient of the stopping material, e.g. a stopping metal. The concentration gradient may increase in a direction from the substrate 2 on which the gate dielectric 3 is formed towards the FUSI gate electrode 4. According to still other embodiments, the gate dielectric 3 may also be formed of a single layer, but the stopping material, e.g. a stopping metal may now be uniformly distributed over the single layer of gate dielectric 3.

In a further aspect, the present disclosure also provides a method for forming a semiconductor device 1. A dielectric 3 is provided on a substrate 2. In the illustrations, the dielectric is a gate dielectric. A fully silicided electrode 4, such as a gate electrode, is provided on and in direct contact with the dielectric 3. The fully silicided electrode 4 comprises an alloy of a semiconductor material and a metal and further comprises a workfunction modulating element. In this embodiment, a stopping material, such as a stopping metal, is provided in at least part of the dielectric 3, this part being in direct contact with the fully silicided electrode 4 for substantially preventing implantation into and/or diffusion towards the dielectric 3 of the workfunction modulating element.

Hereinafter, exemplary methods for forming a semiconductor device 1 will be described by means of the planar MOSFET device 1 illustrated in FIG. 3. Subsequent steps of the method will be described by means of FIG. 7a to FIG. 7e. It should be understood that methods comprising other steps or another sequence of steps are also included in the scope of the claimed invention.

Figure 7A:
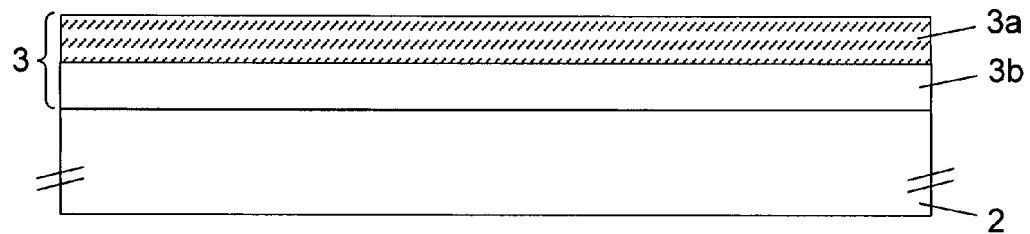
FIG. 7a to FIG. 7e illustrate by means of schematic cross-sections subsequent steps in a process flow for fabricating CMOS devices.

As shown in FIG. 7a, in a first step, a substrate 2 is provided. Onto the substrate 2, a dielectric layer 3 formed by a stack of a first and a second dielectric layer 3a, 3b is provided. These layers 3a, 3b may be separately provided by, for example, chemical vapor deposition (CVD) such as e.g. atomic layer deposition (ALCVD). Alternatively, a single layer of dielectric material 3 may be provided. In the example given, the gate dielectric 3 comprises multiple layers of dielectric material 3a, 3b whereby the first dielectric layer 3a, which is in direct contact with the alloy of the gate electrode 4, comprises a stopping material, e.g. a stopping metal, such as e.g. a lanthanide (e.g. hafnium) or aluminium, while the lower dielectric layer 3b, which is not in direct contact with the gate electrode 4, may be a dielectric layer as known by a person skilled in the art such as a silicon oxide, a silicon oxynitride, a high-k dielectric, or combinations thereof. Hence, according to the present example, first, the second dielectric layer 3b may be provided on the substrate 2. Onto the second dielectric layer 3b, the first dielectric layer 3a comprising the stopping material, e.g. a stopping metal, may be provided. However, according to other embodiments, the gate dielectric 3 may be provided in other ways, as described in further detail below.

In a specific example, the stopping material, e.g. a stopping metal, may be hafnium (Hf). According to this specific example, the gate dielectric 3 may comprise a stack of a hafnium-comprising layer 3a such as e.g. hafnium oxide, hafnium silicon oxide or hafnium silicon oxynitride, which is in direct contact with the gate electrode 4, and a second dielectric layer 3b such as silicon oxide ($SiO_2$) or silicon oxynitride (SiON). In the examples given, the thickness of the dielectric stack 3 may be in the range of between 1 nm and 10 nm, for example in the range of between 1 nm and 5 nm. The thickness of the first dielectric layer 3a comprising the stopping material, e.g. stopping metal, may range from one or more monolayers to about 10 nm. In case the thickness of the metal comprising dielectric layer 3a is in the range of about 10 nm, the dielectric stack 3 may only comprise a single layer 3a of stopping material comprising dielectric material and does not comprise a second dielectric layer 3b. According to other embodiments, the thickness of the first dielectric layer 3a comprising the stopping metal, in the example given the hafnium comprising layer, may be in the range of between 0.1 nm and 3 nm, for example in the range of between 0.1 nm and 1 nm. The thickness of the stopping material comprising layer 3a may be selected to essentially maintain the polarity type, i.e., n-type or p-type, of the workfunction of the FUSI gate electrode 4. The second gate dielectric layer 3b may, according to a specific example, be a silicon oxynitride layer.

As already described above, according to other embodiments, the gate dielectric 3 may also be formed of a single layer. The stopping material, e.g. a stopping metal, may then be provided so that a concentration gradient exists. The concentration gradient of stopping material, e.g. a stopping metal, may increase in a direction from the substrate 2 on which the gate structure 2, 3 is formed towards the gate electrode 4. According to other embodiments, the stopping material, e.g. a stopping metal, may be provided so that it is uniformly distributed in the gate dielectric 3, and in that case, the dielectric stack 3 only comprises a single layer 3a of first dielectric material comprising the stopping material, e.g. stopping metal.

Figure 7B:
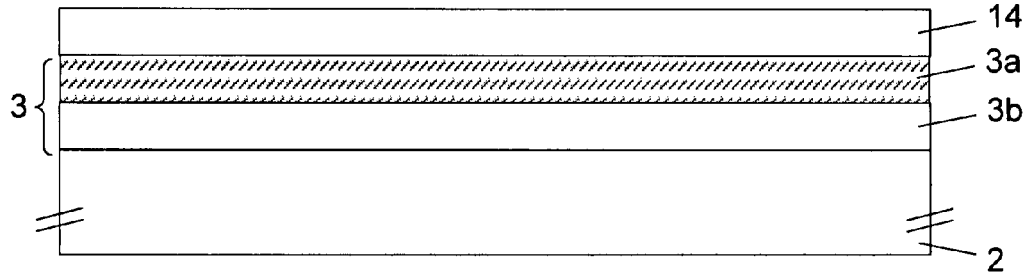

As shown in FIG. 7b, in a next step, a layer 14 of semiconductor material may be deposited on the gate dielectric 3. The semiconductor layer 14 may have a thickness in the range of between 40 nm and 150 nm and may, for example, be 100 nm. The semiconductor material may, for example, be silicon, such as polycrystalline silicon, or silicon germanium or germanium. On top of the semiconductor layer 14 a capping layer, which may also be referred to as sacrificial layer, may be formed (not shown in the figures). The material of the capping layer may be such that it can be selectively removed with respect to the semiconductor layer 14. The capping layer may, for example, be a silicon germanium layer if silicon is used to form the semiconductor layer 14. The capping layer may, in a further step of the formation of the gate electrode, be used for modulating the height of the gate electrode as known by a person skilled in the art. On top of the sacrificial layer a stop layer may be formed (not shown in the figures). The material of the stop layer may be such that it can be selectively removed with respect to the other layers on the substrate 2. This stop layer may be used as a stop layer in a chemical-mechanical processing step. The stop layer may, for example, be a silicon nitride layer.

Figure 7C:
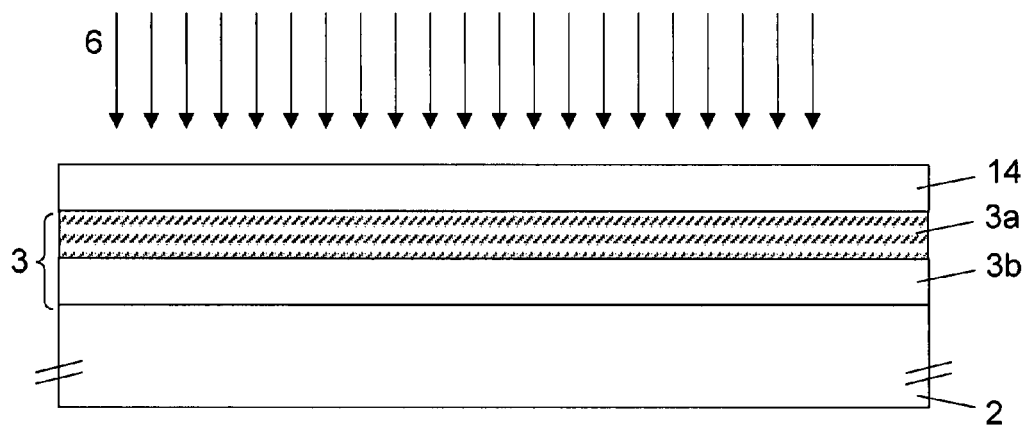

As shown in FIG. 7c, a workfunction modulating element, e.g. ytterbium may be implanted in the semiconductor layer 14 (indicated with arrows 6 in FIG. 7c). Implantation of the workfunction modulating element may preferably be done uniformly over the substrate 2. The Yb implant dose may be in the range of between 1e15 cm$^{-3}$ and 1e16 cm$^{-3}$, and may for example be 4e15 cm$^{-3}$. The Yb implant energy may be in the range of between 10 keV and 40 keV, for example in the range of between 20 keV and 40 keV.

Figure 7D:
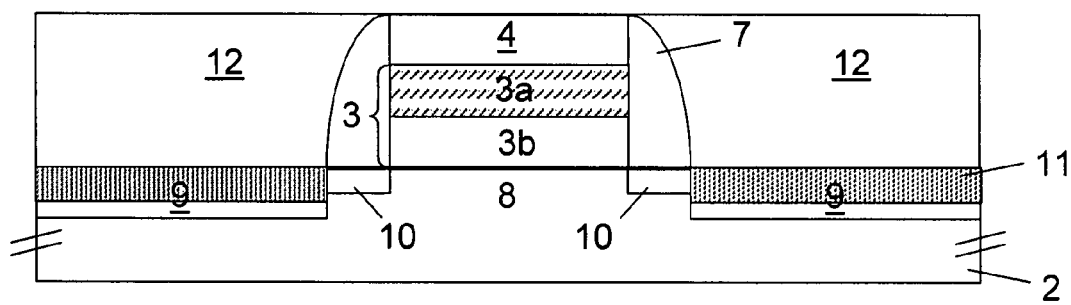

As shown in FIG. 7d, the stack 3 of the dielectric layers 3a, 3b and the semiconductor layer 14, optionally comprising a capping layer and a stop layer (not shown in the figures), may be patterned so as to form a gate stack 3, 4 comprising a gate dielectric 3 and a gate electrode 4. Next, lowly doped junction regions 10 aligned to the gate stack 3, 4 may be formed in the substrate 2. Then, sidewall spacers 7 may be formed against sidewalls of the gate stack 3, 4. These sidewall spacers 7 may be formed of a dielectric material such as e.g. silicon oxide, silicon nitride, silicon carbide, silicon nitride, or a combination thereof. Aligned to the sidewall spacers 7, highly doped junction regions 9 may be formed in the substrate 2. The lowly doped regions 10 and the highly doped regions 9 may form the source and drain regions of the semiconductor device 1. The source and drain regions 9, 10 may be formed on opposite sides of a channel region 8 of the semiconductor device 1. After the implantation steps to form the highly doped regions 9 a thermal treatment, such as a spike anneal, can be performed.

In a next step, a layer of a silicide-forming metal, such as nickel, may be deposited. The layer of silicide-forming metal, such as nickel, may have a thickness of between 10 nm and 50 nm and may, for example, have a thickness of 10 nm. Next, a two-step thermal process may be performed to form silicides 11 on the exposed source and drain regions 9. In a first step, the temperature may range from 150° C. to 350° C., for a period of between 10 s and 5 minutes. For example, the temperature of the first thermal step may be 300° C. for a time period of 30 s. After the first thermal step, the unreacted metal, e.g. nickel may be removed. This may, for example, be done by using a wet etch, such as an etch comprising HCl. Then, a second thermal step is performed. The temperature of the second thermal step may range from 300° C. to 550° C. for a time period of between 10 s and 5 minutes. For example, the temperature of the second thermal step may be 470° C. for a time period of 30 s.

In a next step, a planarizing layer 12 may be deposited. The planarizing layer 12 may, for example, be a silicon oxide layer and may, for example, be deposited using chemical vapor deposition (CVD). The planarizing layer 12 may be polished down, e.g., using chemical-mechanical-polishing (CMP), thereby stopping on the optional stop layer, if present. If no stop layer is present, polishing may stop at the silicide of the gate electrode 4. When present, the stop layer and the capping may then be removed, for example by using a dry etch process, thereby exposing the FUSI gate electrode 4 of the MOSFET device 1.

Figure 7E:
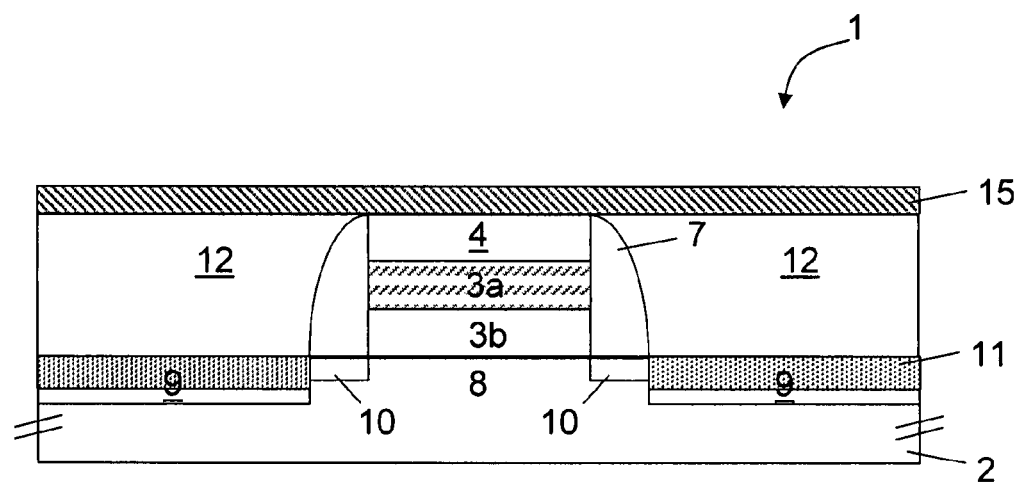

As shown in FIG. 7e, a layer 15 of silicide-forming metal may be deposited over the structure obtained up till now. The silicide-forming metal layer 15 may, for example, be a nickel or a nickel alloy layer. The silicide-forming metal layer 15 may have a thickness in the range of between 40 nm and 80 nm, and may, for example, be 60 nm. Silicidation to form a FUSI gate electrode 4 may be performed using a two-step thermal process. A first thermal process step may be performed to have the deposited silicide-forming metal layer 15 react with the Yb-semiconductor gate electrode 4. In this first thermal step, the temperature may range from 250° C. to 400° C. for a time period of between 10 s and 5 minutes. For example, the temperature of the first thermal step may be 370° C. for a time period of 30 s. Thereafter, the unreacted silicide-forming metal 15 may selectively be removed, for example by using a wet etch. Depending on the thermal budget of the first thermal process step the n-type MOS gate electrode 4 can be fully silicided or only partially silicided, thereby leaving a semiconductor portion adjacent to the gate dielectric 3a. During a second thermal step a partially silicided gate electrode 4 may become fully silicided as the un-silicided bottom portion of the gate electrode 4 will further react with the silicide-forming metal 15 in the silicided portion.

In the embodiments below, examples of variations on the process sequence of manufacturing a semiconductor device 1 as described above will be described.

According to a first alternative embodiment, the gate dielectric 3 may be formed by first depositing a dielectric layer 3 and then incorporating a stopping material, e.g. a stopping metal such as hafnium, in a top part 3a of the gate dielectric 3. This stopping material can be incorporated in the top part 3a by, for example, ion implantation or plasma doping. According to embodiments of the present embodiment, first a dielectric layer 3b may be selected to determine the equivalent electrical oxide thickness (EEOT) of the gate dielectric 3, which depends on the kind of semiconductor device 1 to be formed. Once this part of the gate dielectric 3 is completed, the stopping material may be added to the dielectric forming species used to form the dielectric 3, such that the stopping-material-comprising top part 3a is formed and a complete gate stack 3 as described earlier is formed. In that case, the EEOT may be determined by the thickness and type of the second dielectric layer 3b. Forming a stopping material, e.g. metal comprising dielectric layer 3a then only has the purpose of providing a way to prevent implantation into and/or diffusion towards the dielectric stack 3 of the workfunction modulating element and does not influence the EEOT of the dielectric stack 3. According to a specific example of this embodiment, a SiON layer can be deposited whereby at the end of the forming process hafnium is added such that a HfSiON 3a-SiON 3b layer gate dielectric stack 3 is obtained.

Optionally, an additional heat treatment may be performed after the gate stack 3, 4 is formed. This additional heat treatment step may, for example, be a rapid thermal process step (RTP) or a furnace anneal.

Instead of doping only the top part 3a of the gate dielectric 3, the complete gate dielectric 3 may be doped with a suitable stopping material, e.g. stopping metal. The doping may be performed such that a concentration gradient of the stopping material, e.g. stopping metal, exists. The concentration gradient may increase in a direction from the substrate 2 on which the gate dielectric 3 is formed towards the gate electrode 4. In other words, in the example given, the amount of stopping material, e.g. stopping metal, such as hafnium, may increase from an interface of the gate dielectric 3 with the channel region 8 of the semiconductor device 1 towards an interface of the gate dielectric 3 with the FUSI gate electrode 4. The increase can be gradual when the amount of stopping material, e.g. a stopping metal such as hafnium, during formation of the gate dielectric 3 is gradually increased. According to other embodiments, the increase can be abrupt when initially, when starting to form the gate dielectric 3, the stopping material is not present and at a particular time, the stopping material is provided in the dielectric formation process. According to a specific embodiment of the present embodiment, a SiON layer 3 can be deposited whereby, during the forming process, hafnium is added such that SiON layer with hafnium gradient is formed.

For heuristic purposes, the steps and the schematics relevant to the formation of an n-type MOSFET device 1 were discussed above. A person skilled in the art will realize that if a p-type MOSFET with a p-type gate electrode 4 comprising a high workfunction metallic alloy is to be formed, similar processing steps may be performed. Hence, the process steps disclosed can also be applied to form such a p-type FUSI gate electrode 4 on a stopping material, comprising layer 3a or gate dielectric 3.

It is to be understood that although preferred embodiments, specific constructions and configurations, as well as materials, have been discussed herein for with respect to particular embodiments, various changes or modifications in form and detail may be made without departing from the scope of this invention as defined by the appended claims.

The invention claimed is:

1. A semiconductor device comprising:
    a fully solicited electrode formed of an alloy of a semiconductor material and a metal and comprising a workfunction modulating element for modulating a workfunction of the alloy; and
    a dielectric wherein at least a portion of the dielectric is in direct contact with the fully silicided electrode and comprises a stopping metal for preventing the workfunction modulating element from diffusion into the dielectric, the stopping metal having a thickness of between 0.135 nm and 10 nm.

2. A semiconductor device according to claim 1, wherein the stopping metal is selected from the group consisting of lanthanides and aluminum.

3. A semiconductor device according to claim 2, wherein the stopping metal is hafnium.

4. A semiconductor device according to claim 1, wherein the dielectric comprises at least a first layer and a second layer, wherein the first layer is in direct contact with the fully silicided electrode and comprises the stopping metal.

5. A semiconductor device according to claim 1, the dielectric being formed of a single layer, wherein the single layer of dielectric comprises a concentration gradient of the stopping metal increasing towards the fully silicided electrode.

6. A semiconductor device according to claim 1, the dielectric being formed of a single layer, wherein the stopping metal is uniformly distributed over the single layer of dielectric.

7. A semiconductor device according to claim 1, wherein the part of the dielectric comprising the stopping metal furthermore comprises at least one of Si, O, and N.

8. A semiconductor device according to claim 1, wherein the semiconductor material comprises one of silicon, silicon germanium, and germanium.

9. A semiconductor device according to claim 1, wherein the metal is selected to form an alloy having a midgap-type workfunction.

10. A semiconductor device according to claim 1, wherein the metal comprises nickel.

11. A semiconductor device according to claim 1 wherein the workfunction modulating element is selected to modulate the workfunction of the alloy towards an n-type workfunction.

12. A semiconductor device according to claim 11, wherein the workfunction modulating element is selected from the group of lanthanides.

13. A semiconductor device according to claim 12, wherein the workfunction modulating element is ytterbium.

14. A method for forming a semiconductor device, the method comprising:
    providing a dielectric on a substrate; and
    providing a fully silicided electrode on and in direct contact with the dielectric, the fully silicided electrode comprising an alloy of a semiconductor material and a metal and a workfunction modulating element;
    wherein the method further comprises:
    providing a stopping metal in at least a part of the dielectric, the part being in direct contact with the fully silicided electrode and substantially preventing the workfunction modulating element from diffusion into the dielectric and having a thickness of between 0.135 nm and 10 nm.

15. A method according to claim 14, wherein providing a dielectric is performed by providing a stack of at least a first and second layer, the first layer being in direct contact with the fully silicided electrode, wherein providing a stopping metal in at least part of the dielectric is performed by providing the stopping metal in the first layer.

16. A method according to claim 14, wherein providing a dielectric is performed by providing a single layer, and providing a stopping metal in at least a part of the dielectric is performed such that a concentration gradient of the stopping metal increasing towards the fully silicided electrode is built up.

17. A method according to claim 14, wherein the stopping metal is selected from the group of lanthanides and aluminum.

18. A method according to claim 17, wherein the stopping metal is hafnium.

19. A method according to claim 14, wherein providing a fully silicided electrode is performed by:
    providing a layer of semiconductor material;
    providing a workfunction modulating element in the semiconductor material;
    providing a layer of metal; and
    forming an alloy of the semiconductor material and the metal.

20. A method according to claim 19, wherein providing a layer of semiconductor material is performed by providing a layer comprising one of silicon, silicon germanium and germanium.

21. A method according to claim 19, wherein providing a layer of metal is performed so as to form an alloy having a midcap-type workfunction.

22. A method according to claim 21, wherein the metal comprises nickel.

23. A method according to claim 14, wherein providing a workfunction modulating element is performed such that the workfunction of the alloy is modulated towards an n-type workfunction.

* * * * *